(12) United States Patent
Yotsuji

(10) Patent No.: US 8,378,721 B2
(45) Date of Patent: Feb. 19, 2013

(54) PHASE-LOCKED LOOP CIRCUIT

(75) Inventor: Tetsuaki Yotsuji, Kyoto (JP)

(73) Assignee: Rohm Co., Ltd. (JP)

( * ) Notice: Subject to any disclaimer, the term of this patent is extended or adjusted under 35 U.S.C. 154(b) by 31 days.

(21) Appl. No.: 13/018,767

(22) Filed: Feb. 1, 2011

(65) Prior Publication Data

US 2012/0112808 A1    May 10, 2012

(30) Foreign Application Priority Data

Feb. 2, 2010    (JP) ................................ 2010-021372

(51) Int. Cl.
*H03L 7/06*    (2006.01)
(52) U.S. Cl. ........................................ 327/156; 327/147
(58) Field of Classification Search .................. 327/147, 327/156
See application file for complete search history.

(56) References Cited

U.S. PATENT DOCUMENTS

| | | | | |
|---|---|---|---|---|
| 5,973,524 A * | 10/1999 | Martin | ........................... | 327/156 |
| 7,468,629 B2 * | 12/2008 | Chien | ........................... | 327/553 |
| 7,495,488 B2 * | 2/2009 | Kim | ............................... | 327/159 |
| 7,519,140 B2 * | 4/2009 | Yoshimura | .................... | 327/156 |
| 7,884,655 B2 * | 2/2011 | Marton et al. | ................. | 327/156 |

* cited by examiner

*Primary Examiner* — Hai L Nguyen
(74) *Attorney, Agent, or Firm* — Cantor Colburn LLP

(57) ABSTRACT

A gm-C VCO oscillates at a frequency that corresponds to an input control voltage. A divider divides the frequency of an oscillation signal output from the gm-C VCO. A phase comparison signal generating unit generates a phase difference signal that corresponds to the phase difference between the oscillation signal thus frequency-divided by the divider and a reference clock signal. A loop filter performs filtering of the phase difference signal so as to generate the control voltage. A startup circuit injects a seed pulse into the gm-C VCO at a timing determined based upon the level of a detection signal that corresponds to the control voltage.

9 Claims, 4 Drawing Sheets

PHASE-LOCKED LOOP CIRCUIT

BACKGROUND OF THE INVENTION

1. Field of the Invention

The present invention relates to a phase-locked loop circuit (PLL) employing a gm-C VCO (voltage-controlled oscillator).

2. Description of the Related Art

In order to generate a cyclic signal having a stable frequency that is synchronous with a reference clock signal, a PLL circuit is employed. A typical PLL circuit includes a VCO (voltage-controlled oscillator), a divider, a phase comparator, and a loop filter. The VCO oscillates at a frequency that corresponds to an input control voltage. The divider divides the frequency of the output signal of the VCO by n. The phase comparator makes a comparison between the phase of the output signal of the VCO and the phase of the reference clock signal, and generates a phase difference signal which indicates the phase difference. The loop filter performs filtering of the phase difference signal, and generates a control voltage to be supplied to the VCO. The output signal of the VCO is output as a cyclic signal obtained by multiplying the frequency of the reference clock signal by n.

In some cases, such a PLL circuit employs a gm-C VCO. FIGS. 1A through 1D are circuit diagrams each showing a configuration of a gm-C VCO 10. FIG. 1A shows an overall configuration of the VCO 10. The gm-C VCO 10 includes a first amplifier 12, a second amplifier 14, and a gyrator 16. The first amplifier 12 has a transconductance $gm_{OSC}$, and the second amplifier 14 has a transconductance gm.

FIG. 1B is a circuit diagram which shows a configuration of the gyrator 16. FIG. 1C is an equivalent circuit diagram showing a circuit obtained by simplifying the gyrator 16 into a single-ended circuit. The gyrator 16 includes a gm cell 18, a first capacitor C1, and a second capacitor C2. The gm cell 18 has a configuration including two gm amplifiers 18a and 18b arranged such that the input terminal of each amplifier is connected (cross-coupled) to the output terminal of the other amplifier. The gm amplifiers 18a and 18b have the same transconductance, which is taken as given to be α•gm. Here, α represents a coefficient. Furthermore, the first capacitor C1 and the second capacitor C2 are taken to have the same capacitance C.

The output current $i_c$ of the first gm amplifier is represented by Expression $i_c = \alpha \cdot gm \cdot V_{in}$. The second capacitor C2 is charged and discharged using the output current $i_c$. Accordingly, the voltage $V_C$ of the capacitor C2 is represented by Expression $V_c = \alpha \cdot gm \cdot V_{in}/sC$.

The output current $i_{in}$ of the gm amplifier 18b is represented by $i_{in} = \alpha \cdot gm \cdot V_c = (\alpha \cdot gm)^2 \cdot V_{in}/sC$. Accordingly, the input impedance $z_{in}$ of the gyrator 16 is represented by $z_{in} = V_{in}/i_{in} = s \cdot C/(\alpha \cdot gm)^2$. That is to say, the gyrator 16 can be seen as equivalent to an inductance represented by $L = C/(\alpha \cdot gm)^2$.

FIG. 1D shows an equivalent circuit diagram showing the VCO 10. The condition for oscillation required by the gm-C VCO 10 is represented by the following Expression (1).

$$gm_{OSC} > gm + 1/R_{gyrator} \quad (1)$$

Here, $R_{gyrator}$ represents the real part of the impedance of the gyrator 16.

By determining the transconductance of the first amplifier 12, i.e., $gm_{OSC}$, and the transconductance of the second amplifier 14, i.e., gm, so as to satisfy Expression (1), the oscillation frequency $f_{OSC}$ of the VCO 10 is represented by the following Expression.

$$f_{OSC} = (\alpha \cdot gm + gm_{OSC} - gm)/(2\pi C) \quad (2)$$

That is to say, the oscillation frequency $f_{OSC}$ receives the effects of the transconductance $gm_{OSC}$ of the first amplifier 12.

However, in some cases, depending on the usage of such a PLL circuit, there is a desire to oscillate such a VCO 10 at a frequency independent of the effects of the transconductance $gm_{OSC}$ of the first amplifier 12. In this case, the following relation should be satisfied.

$$gm_{OSC} = gm \quad (3)$$

In other words, the conductance of the first amplifier 12 and the second amplifier 14 as viewed from the gyrator 16 side, i.e., ($gm_{OSC}$−gm), must be zero. That is to say, the first amplifier 12 and the second amplifier 14 must function as an open circuit as viewed from the gyrator 16 side. When Expression (3) is satisfied, the oscillation frequency $f_{OSC}$ of the VCO 10 is represented by the following Expression.

$$f_{OSC} = (\alpha \cdot gm)/(2\pi C) \quad (4)$$

That is to say, the oscillation frequency $f_{OSC}$ of the VCO 10 is determined by the ratio between the transconductance (α•gm) of the gyrator 16 and the capacitance C.

However, in a case in which the transconductance of the first amplifier 12, i.e., $gm_{OSC}$, and the transconductance the second amplifier 14, i.e., gm, are determined so as to satisfy Expression (3), Expression (1) is not satisfied, leading to a problem in that such a gm-C VCO 10 cannot oscillate.

SUMMARY OF THE INVENTION

An embodiment of the present invention has been made in order to solve such a problem. Accordingly, it is an exemplary purpose of the present invention to provide a PLL circuit employing a gm-C VCO which is capable of reliably oscillating at an oscillation frequency determined by the ratio between the transconductance (α•gm) of a gm cell and the capacitance of a capacitor C.

An embodiment of the present invention relates to a phase-locked loop circuit. The phase-locked loop circuit comprises: a gm-C voltage-controlled oscillator configured to oscillate at a frequency that corresponds to an input control voltage; a divider configured to divide the frequency of an oscillation signal output from the voltage-controlled oscillator; a phase difference signal generating unit configured to generate a phase difference signal that corresponds to a phase difference between the oscillation signal thus subjected to frequency division by the divider and a reference oscillation signal; a loop filter configured to perform filtering of the phase difference signal so as to generate the control voltage; and a startup circuit configured to inject a seed pulse into the voltage-controlled oscillator based upon the level of a detection signal that corresponds to the control voltage.

Such an embodiment provides a gm-C VCO which is capable of oscillating in a sure manner at an oscillation frequency determined by the ratio between the transconductance (α•gm) of the gm cell and the capacitance C of the capacitor.

Also, the startup circuit may comprise a comparator configured to compare the detection signal that corresponds to the control voltage with a predetermined threshold value. Also, the startup circuit may generate the seed pulse according to an output signal of the comparator.

Also, the threshold value may be set to a value outside a range in which the detection signal can be located in a state in which the phase-locked loop circuit is locked.

Another embodiment of the present invention relates to an electronic device. The electronic device comprises: the aforementioned phase-locked loop circuit; and a gm-C filter comprising a gm amplifier, configured to operate receiving the control voltage generated by the phase-locked loop circuit, and a capacitor.

With such an embodiment, the control voltage is stabilized such that the ratio between the transconductance ($\alpha \cdot gm$) of the gm-C VCO and the capacitance C is maintained at a constant level even if the temperature fluctuates or if there are process irregularities. Thus, the ratio between the gm value and the capacitance C is maintained at a constant level in each gm-C filter configured to operate receiving such a control voltage, thereby maintaining the cutoff frequency thereof at a constant level.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, or that does not deteriorate the functions or effects due to the connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not affect the electric connection therebetween, or that does not deteriorate the functions or effects due to the connection therebetween, in addition to a state in which the member A is directly connected to the member C, or the member B is directly connected to the member C.

Figure 1A:
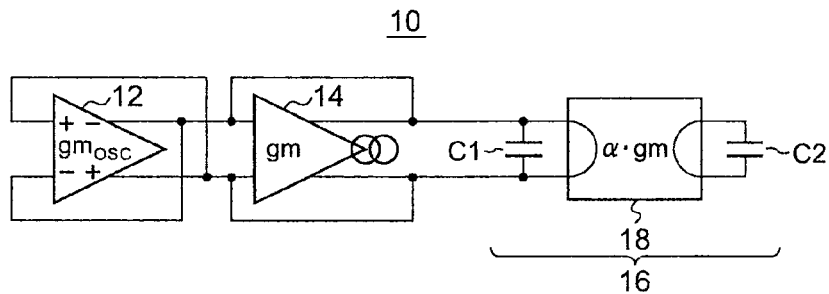
FIGS. 1A through 1D are circuit diagrams each showing a configuration of a gm-C VCO.
Figure 1B:
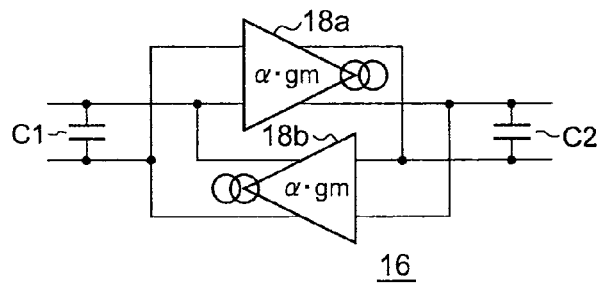
Figure 1C:
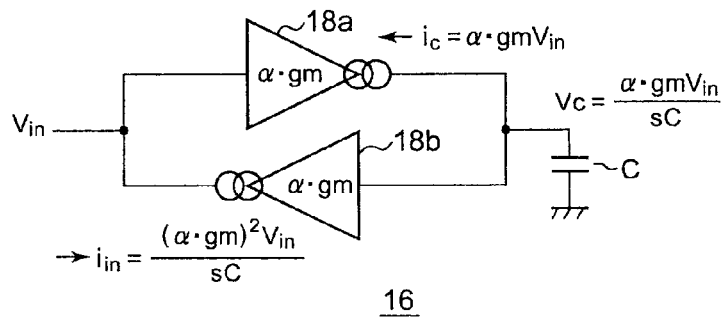
Figure 1D:
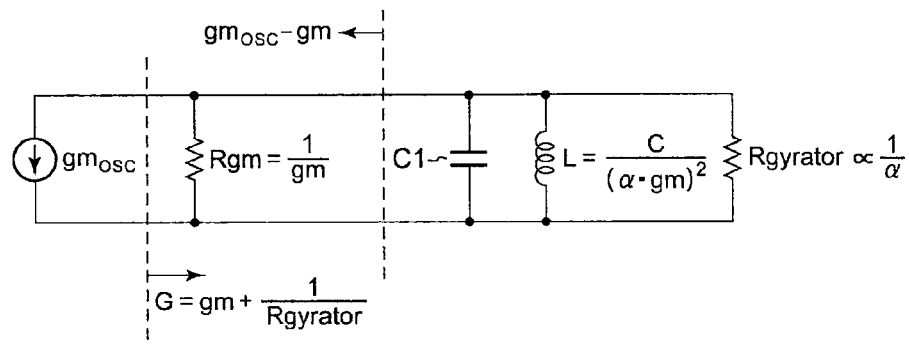
Figure 2:
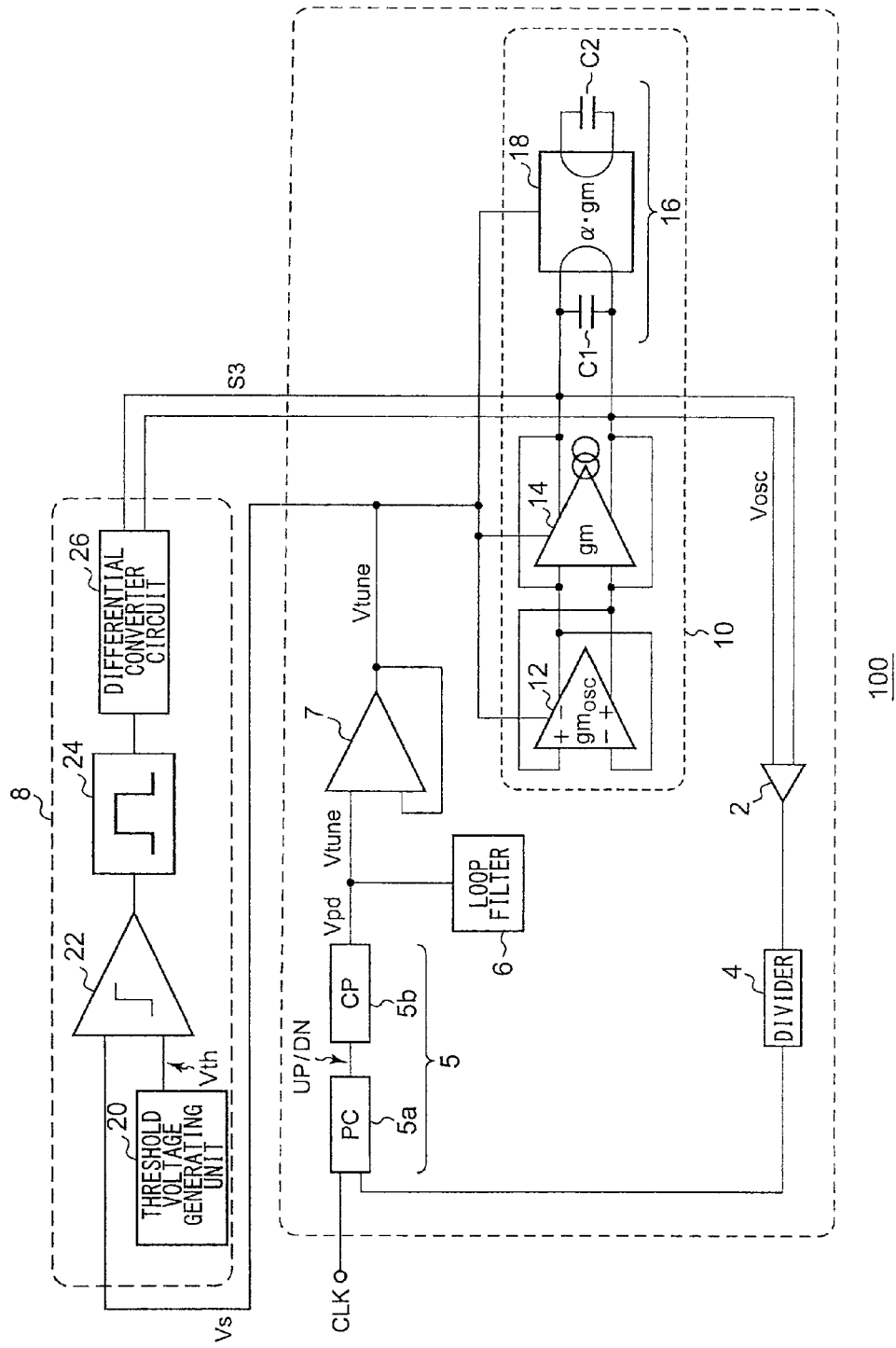
FIG. 2 is a circuit diagram which shows a configuration of a PLL circuit according to an embodiment.

FIG. 2 is a circuit diagram which shows a configuration of a PLL circuit according to an embodiment. The PLL circuit 100 includes a gm-C VCO 10, an amplifier 2, a divider 4, a phase comparison signal generating unit 5, a loop filter 6, a buffer 7, and a startup circuit 8.

The gm-C VCO 10 oscillates at a frequency $f_{OSC}$ that corresponds to an input control voltage Vtune. The gm-C VCO 10 has the same configuration as that described above with reference to FIGS. 1A through 1D. The control voltage Vtune is supplied to a first amplifier 12 and a second amplifier 14, and gm amplifiers 18a and 18b that are each configured as an internal component of the gm cell 18. As a result, the transconductances $gm_{OSC}$, gm, and ($\alpha \cdot gm$) each receive the effects of temperature and process irregularities, and each change according to the control voltage Vtune.

The gm-C VCO 10 shown in FIG. 2 is designed so as to satisfy the following Expression (3).

$$gm_{OSC} = gm \quad (3)$$

Accordingly, the oscillation frequency $f_{OSC}$ of the gm-C VCO 10 is represented by the following Expression (4).

$$f_{OSC} = (\alpha \cdot gm)/(2\pi C) \quad (4)$$

That is to say, the oscillation frequency $f_{OSC}$ of the gm-C VCO 10 is determined by the ratio between the transconductance ($\alpha \cdot gm$) of the gyrator 16 and the capacitance C of the capacitors C1 and C2.

The amplifier (comparator) 2 converts the oscillation signal $V_{OSC}$, output from the gm-C VCO 10 in the form of a differential signal, into a single-ended signal. The divider 4 divides the frequency of the oscillation signal $V_{OSC}$ by n. Here, n represents an integer. The divider outputs an oscillation signal $V_{OSC}'$ having a frequency represented by the Expression $f_{OSC}/n$.

The phase comparison signal generating unit 5 receives the oscillation signal $V_{OSC}'$ and a reference clock CLK having a reference frequency $f_{ref}$. The phase comparison signal generating unit 5 generates a phase difference signal Vpd that corresponds to the phase difference between the oscillation signal $V_{OSC}'$ and the reference clock CLK. For example, the phase comparison signal generating unit 5 includes a phase comparator 5a and a charge pump circuit 5b. The phase comparator 5a compares the edge timing of the oscillation signal $V_{OSC}'$ with the edge timing of the reference clock signal CLK. When the phase of the oscillation signal $V_{OSC}'$ is delayed as compared to the phase of the reference clock signal CLK, the phase comparator 5a asserts an up signal UP. When the phase of the oscillation signal $V_{OSC}'$ is advanced as compared to the phase of the reference clock signal CLK, the phase comparator 5a asserts a down signal DN. When the up signal UP is asserted, the charge pump circuit 5b charges the capacitor, and when the down signal DN is asserted, the charge pump circuit 5b discharges the capacitor. The voltage across the capacitor is output as the phase difference signal Vpd.

The loop filter 6 is a low-pass filter configured to perform filtering of the phase difference signal Vpd so as to generate the control voltage Vtune. The control voltage Vtune is supplied to the gm-C VCO 10 via the buffer (voltage follower) 7.

The configurations of the phase comparison signal generating unit 5 and the loop filter 6 according to the present invention are not restricted to such an arrangement shown in FIG. 2. Also, other configurations may be also employed.

By means of a loop comprising the phase comparison signal generating unit 5, the loop filter 6, the buffer 7, the gm-C VCO 10, the amplifier 2, and the divider 4, a feedback operation is performed so as to fulfill the condition $f_{OSC} = n \times f_{ref}$, thereby adjusting the control voltage Vtune.

The respective transconductances of the first amplifier 12, the second amplifier 14, and the gyrator 16, i.e., $gm_{OSC}$, gm, and ($\alpha \cdot gm$), each fluctuate according to temperature and process irregularities. However, the control voltage Vtune is adjusted so as to cancel out this fluctuation, thereby maintaining the oscillation frequency $f_{OSC}$ at a constant level.

With the PLL circuit 100 shown in FIG. 2, when the first amplifier 12 and the second amplifier 14 are designed so as to satisfy Expression (3), the condition for oscillation (1) required by the gm-C VCO 10 is not satisfied. Accordingly, the gm-C VCO 10 does not oscillate, leading to a problem in that the PLL circuit 100 is not locked. In order to solve such a problem, the startup circuit 8 is provided to the PLL circuit 100.

The startup circuit 8 injects a seed pulse (trigger pulse) S3 into the gm-C VCO 10 at a timing determined based upon the level of a detection signal Vs that corresponds to the control voltage Vtune. FIG. 2 shows an arrangement in which the control voltage Vtune itself is used without change as a detection signal Vs. Also, a voltage obtained by dividing the control voltage Vtune may be used as the detection signal Vs.

The startup circuit 8 includes a threshold voltage generating unit 20, a comparator 22, a pulse generating unit 24, and a differential converter circuit 26. The threshold voltage generating unit 20 generates at least one threshold voltage Vth. The comparator 22 compares the detection signal Vs with the threshold voltage Vth.

When the PLL circuit 100 enters a locked state, the control voltage Vtune converges to a predetermined range. However, when the PLL circuit 100 cannot be locked, the control voltage Vtune deviates from this range. Thus, by setting the level of the threshold voltage Vth to a boundary of the range, or a level across the boundary outside the range, such an arrangement is capable of judging whether or not the gm-C VCO 10 oscillates.

An output signal S1 of the comparator 22 is input to the pulse generating unit 24. The output signal S1 indicates a timing at which the control voltage Vtune crosses the threshold voltage Vth. When the control voltage Vtune crosses the threshold voltage Vth, i.e., when an edge occurs in the output signal S1 of the comparator 22, the pulse generating unit 24 generates a pulse signal S2 which is set to high level during a predetermined period of time. The differential converter circuit 26 converts the pulse signal S2 into a differential signal so as to generate a seed pulse S3. The seed pulse S3 thus generated is injected into a connection node that connects the gyrator 16 and the second amplifier 14.

Figure 3:
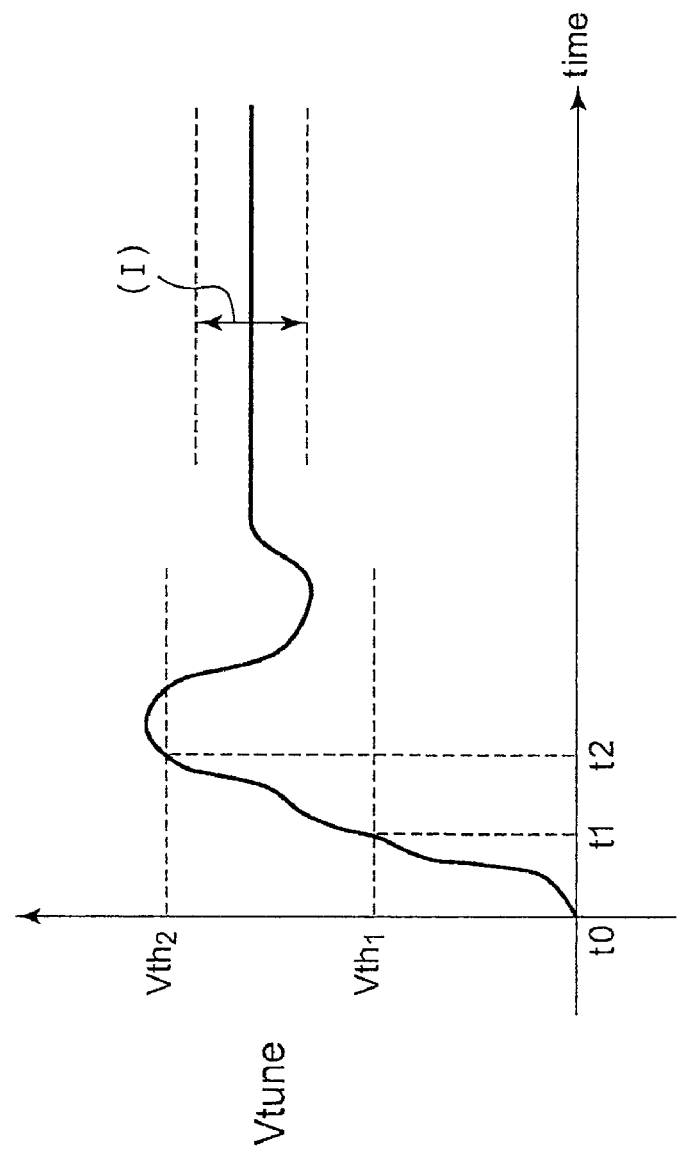
FIG. 3 is a waveform diagram which shows a control voltage Vtune when the PLL circuit is started up.

The above is the configuration of the PLL circuit 100. Next, description will be made regarding the operation thereof. FIG. 3 is a waveform diagram showing the control voltage Vtune generated when the PLL circuit 100 is started up. FIG. 3 shows two threshold voltages $Vth_1$ and $Vth_2$. Furthermore, FIG. 3 shows the voltage range (I) in which the control voltage Vtune can be located in the state in which the PLL circuit 100 is locked. The threshold voltage $Vth_1$ is set to a value that is lower than the voltage range (I), and the threshold voltage $Vth_2$ is set to a value that is higher than the voltage range (I).

At the time point t0, the PLL circuit 100 is started up. Immediately after the PLL circuit 100 is started up, the condition for oscillation (1) is not satisfied in the gm-C VCO 10. As a result, in this stage, the gm-C VCO 10 does not oscillate, and accordingly, the oscillation voltage $V_{OSC}$ has an essentially constant level. In a case in which this state continues, the control voltage Vtune rises over time by the feedback operation of the PLL circuit. Subsequently, when the control voltage Vtune crosses the threshold voltage $Vth_1$ (time point t1), the seed pulse S3 is injected. If the seed pulse S3 cannot cause the gm-C VCO 10 to oscillate, the control voltage Vtune continuously rises. When the control voltage Vtune crosses the second threshold voltage $Vth_2$, the seed pulse S3 is injected again (time point t2). When the gm-C VCO 10 starts to oscillate due to the seed pulse S3, the control voltage Vtune is adjusted such that the oscillation frequency $f_{OSC}$ of the gm-C VCO 10 approaches the target value represented by Expression (4).

The above is the operation of the PLL circuit 100. With the PLL circuit 100, the oscillation frequency $f_{OSC}$ can be stabilized to a value determined by the ratio between the transconductance (α•gm) and the capacitance C. Furthermore, such an arrangement is capable of reliably oscillating the gm-C VCO 10.

$$f_{OSC}=(\alpha \cdot gm)/(2\pi C) \qquad (4)$$

Figure 4:
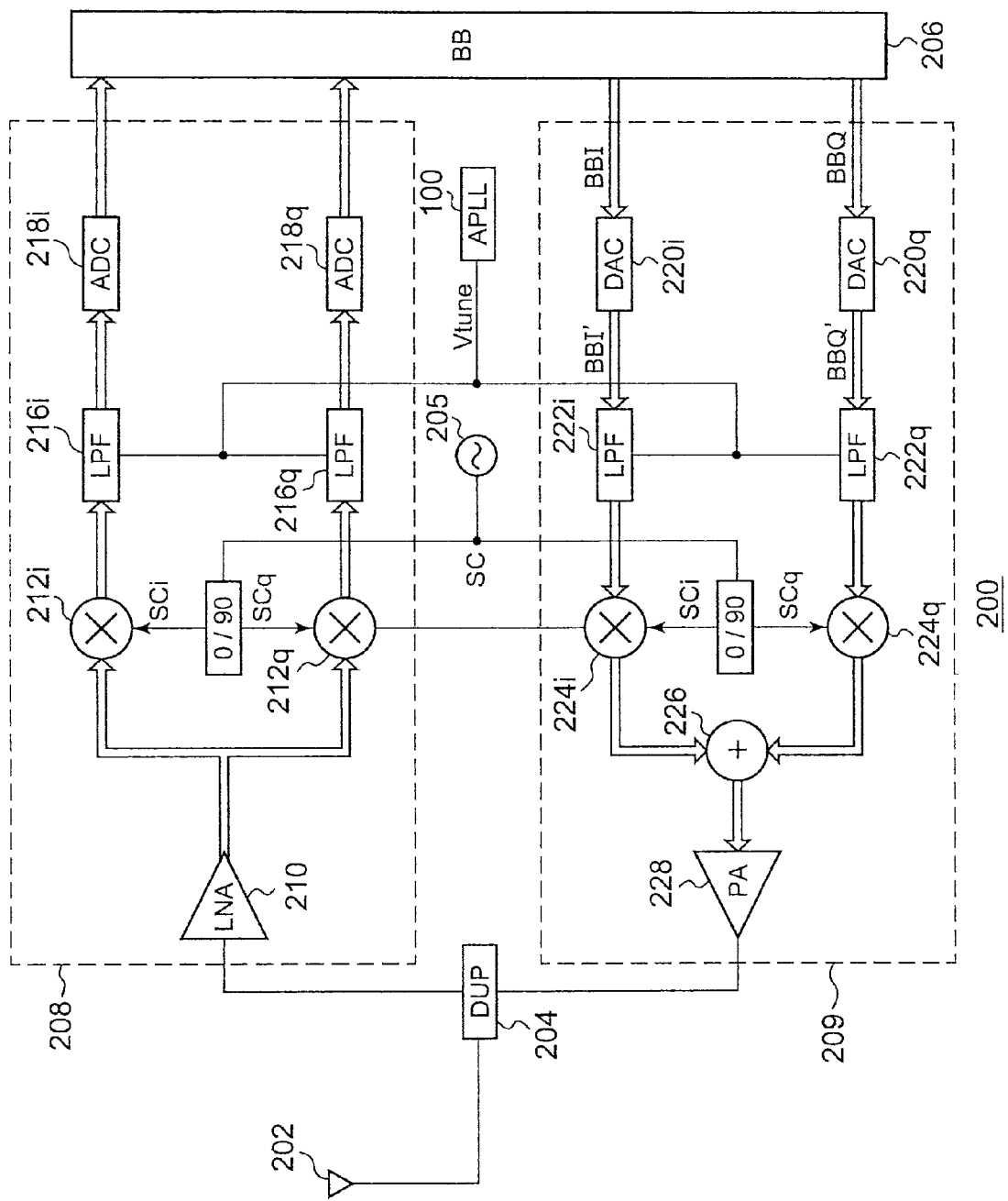
FIG. 4 is a block diagram which shows a configuration of a communication device employing the PLL circuit according to an embodiment.

Next, description will be made regarding a suitable application of the PLL circuit 100. FIG. 4 is a block diagram which shows a configuration of a communication device employing the PLL circuit 100 according to the embodiment.

A communication device 200 is an electronic device such as a cellular phone terminal, PHS device, or wireless LAN device, having a communication function. The communication device 200 includes an antenna 202, a duplexer 204, an oscillator 205, a baseband circuit 206, a reception circuit 208, and a transmission circuit 209. The communication device 200 is configured using a direct conversion system.

The baseband circuit 206 generates a digital baseband signal BBI/BBQ to be transmitted. The I component (in-phase component) and the Q component (quadrature component) are configured in the same way. Accordingly, description will be made regarding the configurations of the transmission circuit 209 and the reception circuit 208 focusing on the I component.

First, description will be made regarding the transmission circuit 209. A D/A converter 220i converts a digital baseband signal BBI into an analog baseband signal BBI'. A low-pass filter 222i removes the frequency components of the analog baseband signal BBI' that are higher than a cutoff frequency fc.

The oscillator 205 generates a carrier signal SC having a carrier frequency. A mixer circuit 224i performs frequency mixing of the in-phase carrier signal SC and the output signal of the low-pass filter 222i so as to perform up-conversion (amplitude modulation). An adder 226 combines the output signals of the respective mixer circuits 224 provided for the I component and the Q component. A PA (Power Amplifier) 228 amplifies the output signal of the adder 226. The duplexer 204 receives a signal output from the PA 228, and transmits the signal thus received to the antenna 202.

The above is the configuration of the transmitter side.

Next, description will be made regarding the configuration of the reception circuit 208. A signal received via the antenna 202 is input to the reception circuit 208 via the duplexer 204. An LNA (Low Noise Amplifier) 210 amplifies the signal received by the antenna 202. A mixer circuit 212i performs mixing of the received signal and the in-phase carrier signal SCi so as to perform down-conversion to a baseband frequency. A low-pass filter 216i performs filtering of the down-converted in-phase signal. An A/D converter 218i converts an output signal of the low-pass filter 216i into a digital signal, and outputs the digital signal thus converted to the baseband circuit 206.

In the communication device 200 shown in FIG. 4, the low-pass filters 216i, 216q, 222i, and 222q are each configured as a gm-C filter. Such a gm-C filter has a basic configuration including a gm amplifier and a capacitor C to be charged and discharged using the output current of the gm amplifier. With such an arrangement, the cutoff frequency of the gm-C filter is determined by the ratio between the transconductance gm of the gm amplifier and the capacitance of the capacitor, i.e., (gm/C). A common control voltage Vtune is supplied to the gm amplifier included in the gm-C filter and a gm amplifier which is an internal component of the PLL circuit. It should be noted that the specific configuration of such a gm-C filter is not restricted in particular. Rather, various kinds of known configurations or prospectively available configurations may be employed.

At least the automatic tuner PLL (APLL) circuit 100 and the low-pass filters 216 and 222 are formed in the same semiconductor substrate. The first amplifier 12 and the second amplifier 14, and the gm amplifiers 18a and 18b, which are components of the PLL circuit 100, and the gm amplifiers included in the low-pass filters 216 and 222, are formed in the vicinity of each other. In the same way, the capacitors C1 and C2 of the PLL circuit 100 and the capacitors of the low-pass filters 216 and 222 are formed in the vicinity of each other. As a result, the PLL circuit 100 and the low-pass filters 216 and 222 each operate at nearly the same temperature, and each have nearly the same process irregularities.

In a case in which the low-pass filters 216 and 222 are configured employing a gm-C filter, the cutoff frequency fluctuates due to process irregularities in the transconductance gm and the capacitance C or due to changes in temperature. With the communication device 200 shown in FIG. 4, the control voltage Vtune is adjusted by the PLL circuit 100 such that the ratio ($\alpha \cdot$gm/C) is maintained at a constant level regardless of the temperature and process irregularities. Furthermore, the common control voltage Vtune is supplied to each of the low-pass filters 216 and 222. Thus, the ratio gm/C is maintained at a constant level in the low-pass filters 216 and 222, thereby suppressing fluctuation in the cutoff frequency.

Description has been made regarding the present invention with reference to the embodiments. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Also, an arrangement may be made in which, when the startup circuit 8 detects that the gm-C VCO 10 is not oscillating, the startup circuit 8 injects the seed pulse S3. For example, the startup circuit 8 may receive a signal which indicates that the gm-C VCO 10 is not oscillating, from a circuit which operates receiving the oscillation signal $V_{OSC}$ generated by the gm-C VCO 10. Also, upon receiving such a signal, the startup circuit 8 may inject the seed pulse S3. Alternatively, because the gm-C VCO is not oscillating immediately after the PLL circuit 100 is started up, an arrangement may be made in which the startup circuit 8 monitors the power supply voltage Vdd, and injects the seed pulse S3 upon detecting a rise in the power supply voltage Vdd.

The application of the PLL circuit 100 is not restricted to such a communication device. Rather, various applications configured to supply the control voltage Vtune to such a gm-C filter may be made.

While the preferred embodiments of the present invention have been described using specific terms, such description is for illustrative purposes only, and it is to be understood that changes and variations may be made without departing from the spirit or scope of the appended claims.

What is claimed is:

1. A phase-locked loop circuit comprising:
    a gm-C voltage-controlled oscillator configured to oscillate at a frequency that corresponds to an input control voltage;
    a divider configured to divide the frequency of an oscillation signal output from the voltage-controlled oscillator;
    a phase difference signal generating unit configured to generate a phase difference signal that corresponds to a phase difference between the oscillation signal thus subjected to frequency division by the divider and a reference oscillation signal;
    a loop filter configured to perform filtering of the phase difference signal so as to generate the control voltage; and
    a startup circuit configured to inject a seed pulse into the voltage-controlled oscillator based upon the level of a detection signal that corresponds to the control voltage,
    wherein the gm-C voltage-controlled oscillator comprises:
        first amplifier having a characteristic of a transconductance;
        a second amplifier structured to be connected to output terminals of the first amplifier and to have the same characteristic of transconductance as the first amplifier; and
        a gyrator connected to the second amplifier and capacitors.

2. The phase-locked loop circuit according to claim 1, wherein the startup circuit comprises a comparator configured to compare the detection signal that corresponds to the control voltage with a predetermined threshold value,
    and wherein the startup circuit generates the seed pulse according to an output signal of the comparator.

3. The phase-locked loop circuit according to claim 2, wherein the threshold value is set to a value outside a range in which the detection signal can be located in a state in which the phase-locked loop circuit is locked.

4. The phase-locked loop circuit according to claim 2, wherein the startup circuit comprises a pulse generating unit configured to be connected the comparator and to generate a pulse signal according to the seed pulse.

5. The phase-locked loop circuit according to claim 4, wherein the pulse generating unit generates the pulse signal which is set to high level during a predetermined period of time when the control voltage crosses the predetermined threshold voltage.

6. The phase-locked loop circuit according to claim 4, wherein the startup circuit comprises a differential converter circuit configured to convert the pulse signal into a differential signal so as to generate the seed pulse.

7. The phase-locked loop circuit according to claim 1, wherein the control voltage is supplied to the first amplifier, the second amplifier, and the gyrator.

8. The phase-locked loop circuit according to claim 1, wherein the oscillation signal generated by gm-C voltage-controlled oscillator is a differential signal.

9. The phase-locked loop circuit according to claim 8, comprising a conversion amplifier converting the differential signal into a single-ended signal transmitted to the divider.

* * * * *